US010586722B2

(12) United States Patent
van der Meulen

(10) Patent No.: US 10,586,722 B2
(45) Date of Patent: Mar. 10, 2020

(54) VACUUM SUBSTRATE STORAGE

(75) Inventor: Peter van der Meulen, Newburyport, MA (US)

(73) Assignee: BROOKS AUTOMATION, INC., Chelmsford, MA (US)

( * ) Notice: Subject to any disclaimer, the term of this patent is extended or adjusted under 35 U.S.C. 154(b) by 293 days.

(21) Appl. No.: 12/131,024

(22) Filed: May 30, 2008

(65) Prior Publication Data

US 2008/0298936 A1 Dec. 4, 2008

Related U.S. Application Data

(60) Provisional application No. 60/940,811, filed on May 30, 2007, provisional application No. 61/049,440, filed on May 1, 2008.

(51) Int. Cl.
*H01L 21/677* (2006.01)
*H01L 21/673* (2006.01)
*H01L 21/67* (2006.01)

(52) U.S. Cl.
CPC .. *H01L 21/67751* (2013.01); *H01L 21/67126* (2013.01); *H01L 21/67353* (2013.01); *H01L 21/67376* (2013.01)

(58) Field of Classification Search
CPC .......... B65D 85/48; G03C 3/00; G03C 3/003; H01L 21/67359; H01L 21/67369; H01L 21/67373; H01L 21/67386
USPC ........ 206/454–455, 710; 220/4.31, 223, 224, 220/213, 623, 780; 355/72–75; 215/316
See application file for complete search history.

(56) References Cited

U.S. PATENT DOCUMENTS

| | | | | |
|---|---|---|---|---|
| 3,157,302 | A | * | 11/1964 | Hakim .......................... 215/214 |
| 3,615,006 | A | * | 10/1971 | Freed ............................ 206/454 |
| 3,953,061 | A | | 4/1976 | Hansen et al. |
| 3,964,636 | A | * | 6/1976 | Rehrig ..................... 220/495.06 |
| 4,154,070 | A | | 5/1979 | Bahry et al. |
| 4,300,674 | A | | 11/1981 | Davet |
| 4,422,547 | A | * | 12/1983 | Abe .......................... G03F 1/66 206/454 |
| 4,470,277 | A | | 9/1984 | Uyeda |
| 4,540,326 | A | * | 9/1985 | Southworth et al. ......... 414/217 |
| 4,687,542 | A | * | 8/1987 | Davis et al. .................. 438/716 |
| 4,706,501 | A | * | 11/1987 | Atkinson .............. G01L 9/0002 73/40.5 R |

(Continued)

FOREIGN PATENT DOCUMENTS

| | | |
|---|---|---|
| JP | 06-0151266 | 5/1994 |
| JP | 09-134952 | 5/1997 |

(Continued)

*Primary Examiner* — Anthony D Stashick
*Assistant Examiner* — Kaushikkumar A Desai
(74) *Attorney, Agent, or Firm* — Perman & Green, LLP; Colin C. Durham

(57) ABSTRACT

A two piece shell is employed for intermediate and long term storage of substrates. The shell is formed of two halves that can be juxtaposed in vacuum and externally vented, with the internal vacuum retaining the halves in vacuum-sealed engagement. One of the halves also provides a vacuum-sealing perimeter for selectively sealing to a process chamber during loading and/or unloading of the shell with a substrate. A vacuum monitor or the like may be employed to monitor pressure during storage and provide alerts if the vacuum within the sealed shell is compromised.

12 Claims, 10 Drawing Sheets

(56) References Cited

U.S. PATENT DOCUMENTS

| | | | |
|---|---|---|---|
| 4,724,874 A * | 2/1988 | Parikh et al. | 141/98 |
| 4,995,430 A * | 2/1991 | Bonora et al. | 141/98 |
| 5,044,871 A * | 9/1991 | Davis | H01L 21/67201 |
| | | | 118/500 |
| 5,399,531 A | 3/1995 | Wu | |
| 5,537,858 A * | 7/1996 | Bauer | H01H 33/668 |
| | | | 218/122 |
| 5,562,383 A * | 10/1996 | Iwai | H01L 21/67769 |
| | | | 118/719 |
| 5,730,573 A | 3/1998 | Masujima et al. | |
| 5,931,512 A | 8/1999 | Fan et al. | |
| 5,976,199 A | 11/1999 | Wu et al. | |
| 6,216,873 B1 | 4/2001 | Fosnight et al. | 206/710 |
| 6,230,895 B1 * | 5/2001 | Laube | 206/710 |
| 6,281,510 B1 * | 8/2001 | Yoshitake et al. | 250/492.2 |
| 6,336,567 B1 | 1/2002 | Hyobu | |
| 6,360,943 B1 * | 3/2002 | Focke et al. | 229/160.1 |
| 6,491,177 B1 | 12/2002 | Hyobu | |
| 6,561,894 B1 * | 5/2003 | Miyajima | H01L 21/67775 |
| | | | 454/187 |
| 6,622,883 B1 | 9/2003 | Wu et al. | |
| 6,646,720 B2 | 11/2003 | Ramamoorthy et al. | |
| 6,906,783 B2 * | 6/2005 | del Puerto et al. | 355/53 |
| 6,955,382 B2 | 10/2005 | Eggum | |
| 6,991,416 B2 | 1/2006 | del Puerto et al. | |
| 7,123,344 B2 | 10/2006 | Van De Ven et al. | |
| 7,151,589 B2 * | 12/2006 | Ham et al. | 355/30 |
| 7,549,552 B2 | 6/2009 | Hasegawa et al. | |
| 2002/0074635 A1 * | 6/2002 | Hattori et al. | 257/678 |
| 2003/0082030 A1 * | 5/2003 | del Puerto et al. | 414/217 |
| 2003/0227605 A1 * | 12/2003 | del Puerto et al. | 355/51 |
| 2004/0129699 A1 * | 7/2004 | Williams | 220/4.31 |
| 2005/0056441 A1 * | 3/2005 | Rider et al. | 174/35 R |
| 2005/0098463 A1 | 5/2005 | Belden et al. | |
| 2005/0286029 A1 * | 12/2005 | Ham et al. | 355/30 |
| 2006/0081488 A1 | 4/2006 | Lax et al. | |
| 2006/0108252 A1 | 5/2006 | Lax | |
| 2007/0261979 A1 * | 11/2007 | Ordonez et al. | 206/408 |
| 2007/0269293 A1 * | 11/2007 | Yu et al. | 414/217 |
| 2008/0080963 A1 | 4/2008 | Bufano et al. | |

FOREIGN PATENT DOCUMENTS

| | | |
|---|---|---|
| JP | 11-163116 | 6/1999 |
| KR | 1020050028751 A | 3/2005 |

* cited by examiner

VACUUM SUBSTRATE STORAGE

RELATED APPLICATIONS

This application claims the benefit of U.S. Prov. App. No. 60/940,811 filed on May 30, 2007 and U.S. Prov. App. No. 61/049,440 filed on May 1, 2008. The entire content of these applications is hereby incorporated by reference.

BACKGROUND

Reticles, wafers, and other semiconductor substrates and the like have very high cost. Exposure to air brings with it the risk of contamination and damage to the substrate, so vacuum environments are commonly used in processing, handling, and using these substrates. While it is possible to store substrates within a vacuum processing environment for short durations, this consumes valuable in-vacuum space and is not generally suitable for longer term storage, particularly where numerous substrates (e.g., the hundreds of reticles that might be needed in a wafer stepper). This approach is also unsuitable where transfer is required between separate vacuum processing environments.

Batch transfer techniques such as multi-wafer carriers have long been employed to transfer wafers among processing systems. In addition, the storage of individual substrates in tightly sealed boxes either under atmospheric or vacuum pressure conditions or under inert environments such as Nitrogen or Argon has been used in the past. However to the present day, these storage boxes require the box to be opened and the substrate to be exposed to a regular air environment, while the substrate is being transferred from the box to a working environment.

There remains a need for single-wafer storage and transportation alternatives that permit transfer of substrates while reducing exposure to the harmful effects of contamination from airborne particles and particles that might be disturbed during pumping and venting cycles.

SUMMARY

A two piece shell is employed for intermediate and long term storage of substrates. The shell is formed of two halves that can be juxtaposed in vacuum and externally vented, with the internal vacuum retaining the halves in vacuum-sealed engagement. One of the halves also provides a vacuum-sealing perimeter for selectively sealing to a process chamber during loading and/or unloading of the shell with a substrate. A vacuum monitor or the like may be employed to monitor pressure during storage and provide alerts if the vacuum within the sealed shell is compromised.

In one aspect, a device disclosed herein includes a first half with a recessed interior shaped and sized to receive a single substrate, a perimeter around the recessed interior including a vacuum gasket; and a second half adjacent to the first half, the second half including an interior face including a surface contacting the vacuum gasket to form a vacuum seal capable of retaining a vacuum within the recessed interior.

The second half may have an interior formed by a perimeter wall, the interior enclosing the first half and the perimeter wall including a second vacuum gasket shaped and sized to form a vacuum seal with a substrate handling device. At least one of the first half and the second half may have a pressure sensor disposed thereon for monitoring a vacuum level within the recessed interior. The pressure sensor may include an active vacuum gauge for measuring pressure based upon a measurement from an interior of the device. The pressure sensor may include an external sensor for measuring pressure based upon a measurement of an exterior of the device. The substrate may include one or more of a wafer and a reticle. The vacuum gasket may be an o-ring, the perimeter including a groove for retaining the o-ring in a predetermined position.

In another aspect, a device disclosed herein includes a container with a recessed interior shaped and sized to receive a single substrate, the recessed interior formed by a bottom and a side wall along a perimeter of the bottom, the side wall having a top edge with an asymmetric vertical feature and a vacuum gasket along an entire length of the top edge including along the asymmetrical vertical feature around the recessed interior including a vacuum gasket; and a lid, the lid having a second asymmetric vertical feature that permits placement of the lid on the container only in a single, predetermined orientation, the lid mating to the top edge to form a vacuum-sealed interior within the container.

The device may include a pressure sensor disposed on one or more of the container or the lid to monitor a vacuum within the vacuum-sealed interior.

In another aspect, a method disclosed herein includes sealing a vacuum chamber with a removable plate; providing a tray within the vacuum chamber; placing a substrate within the tray; moving the tray into a vacuum-sealed engagement with the removable plate to form an enclosed substrate carrier; and venting the vacuum from the vacuum chamber, thereby providing an enclosed substrate carrier containing a substrate in vacuum.

Moving the tray into a vacuum-sealed engagement with the removable plate may include vertically lifting the tray into the removable plate. Moving the tray into a vacuum-sealed engagement may include concurrently physically isolating the tray from the vacuum chamber in a subchamber. Venting the vacuum may include venting only the subchamber. The method may include transporting the substrate in the enclosed substrate carrier. The method may include storing the substrate in the enclosed substrate carrier. The method may include monitoring a vacuum within the enclosed substrate carrier. The substrate may include one or more of a wafer and a reticle. The method may include returning the enclosed substrate carrier to a vacuum processing chamber. The method may include opening the enclosed substrate carrier within the vacuum processing chamber and removing the substrate from the enclosed substrate carrier. Returning the enclosed substrate carrier to a vacuum processing chamber may include returning the enclosed substrate carrier to the vacuum chamber from which the substrate was removed.

BRIEF DESCRIPTION OF THE FIGURES

The foregoing and other objects and advantages of the invention will be appreciated more fully from the following further description thereof, with reference to the accompanying drawings, wherein.

DETAILED DESCRIPTION

The following description emphasizes single substrate carriers for use with vacuum processing. While the following description emphasizes reticles and semiconductor wafers—items that are commonly processed or used in vacuum—it will be appreciated that the principles of this disclosure may be suitably adapted to a wide array of vacuum-based processing and handling systems, and that all such adaptations that would be apparent to one of ordinary skill in the art are intended to fall within the scope of this disclosure.

Figure 1:
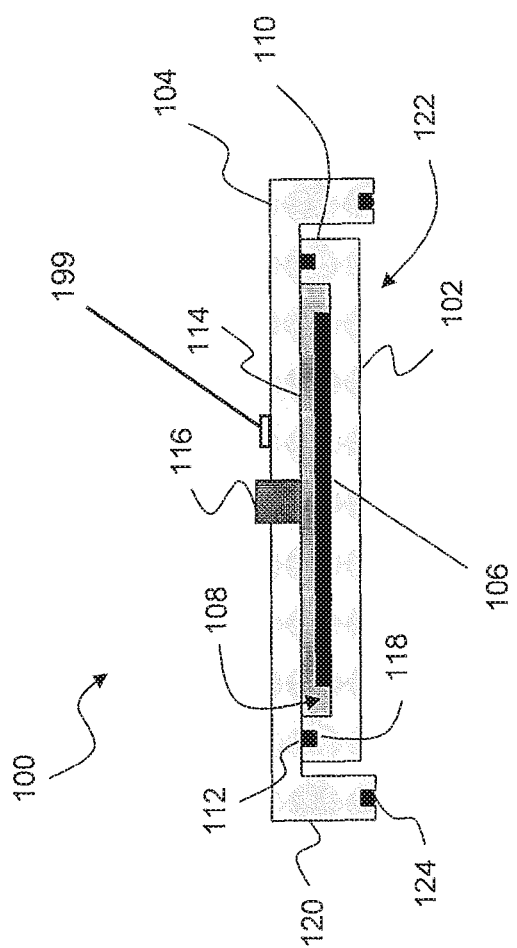
FIG. 1 shows a cross section of a single-substrate carrier.

FIG. 1 shows a cross section of a single-substrate carrier. In general, the carrier 100 includes a first half 102 and a second half 104 that collectively enclose a substrate 106 in a recessed interior 108 of the first half 102, the first half 102 having a recessed interior with an exterior seating base surface opposite the substrate 106 and forming an exterior base of the single-substrate carrier when closed. A perimeter 110 around the first half 102 includes a vacuum gasket 112, being unitary with the exterior seating base surface, where the perimeter 110 meets an interior face 114 of the second half 104. Thus, more generally, the carrier 100 is formed of two shells that cooperate to retain a vacuum seal and hold a wafer or the like in a vacuum environment. With a suitable gasket or other sealing material, this self-sealing, single-wafer carrier can retain a wafer in vacuum for extended periods.

The first half 102 may be formed of aluminum or any other material suitable for use in vacuum environments. In general, the first half 102 serves as a receptacle for a substrate 106 that is to be stored within the carrier 100. The recessed interior 108 is in general shaped and sized to receive the substrate 106. This may include a circular (e.g., wafer) 300 or 450 mm shape, a rectangular (e.g., reticle) shape, or any other shape corresponding to a substrate that is to be sealed and stored within the carrier 100. In general a depth of the recessed interior 108 is minimized in order to reduce the volume of a vacuum environment that is maintained within the carrier 100. It will be understood that, while not depicted, the first half 102 may include stand-offs or the like to support the substrate 106 off an interior surface of the first half 102, and to facilitate handling of the substrate 106 such as placing or removing the substrate 106 with a robotic handler. The perimeter 110 extends generally around an edge of the first half 102 and provides a continuous side wall to form the recessed interior 108. The perimeter may include a groove 118 or the like to support the vacuum gasket 112 in a predetermined position, such as a position to seal against the interior face 114 of the second half 104 when the two halves 102, 104 are placed together. The vacuum gasket 112 may, for example, be an o-ring or the like formed of a material such as Viton suitable for creating a vacuum seal.

The second half 102 may be formed of aluminum or any other material suitable for use in vacuum environments. In general, the second half 102 serves to seal the carrier 100 and retain the substrate 106 in a vacuum environment for transportation or storage. The second half 104 provides an interior face 114 that generally serves to enclose the recessed interior 108 and seal the carrier. While a generally planar interior face 114 is contemplated, other shapes such as concave, convex, compound, mechanically keyed (to the perimeter 118), and the like, as well as combinations of the foregoing, may suitably be employed. The second half 104 may include a perimeter wall 120 forming an interior 122 that encloses the first half 102. The perimeter wall 120 may also include a second vacuum gasket 124 shaped and sized to form a vacuum seal for the interior 122 when placed against a substrate handling device. In general, the substrate handling device may be any device used to handle or process a substrate in a vacuum environment including without limitation, vacuum robotic handlers, load locks, process modules, cluster tools, or any other device or group of devices that maintain a vacuum environment for substrates. Conforming the perimeter wall 120 and second vacuum gasket 124 to such a device depends upon the shape and size of the device, which is generally flexible except that the second vacuum gasket 124 must form a continuous seal capable of preserving a vacuum.

An auxiliary device 116 may be provided to support or enhance operation and use of the carrier 100. For example, the auxiliary device 116 may include a pressure monitor that monitors vacuum within the carrier 100 to ensure that the seal for the carrier 100 is maintained. A number of suitable pressure sensors are known in the art including generally active vacuum gauges and external sensors 199. Active vacuum gauges such as ionization gauges, thermocouple gauges, baratron gauges, can be employed to measure pressure directly within a vacuum environment. While numerous suitable gauges are commercially available, these devices require the presence of sensors on the interior of the carrier 100. External sensors 199 may also or instead be employed to measure a vacuum within the carrier 100 by observations taken from outside the carrier 100. For example, strain gauges or lasers can be employed to measure deflection of an exterior surface of the carrier, and infer interior pressure from this measurement. A pressure sensor may be adapted to create an audible alert or transmit an alert over a wireless network if the vacuum seal is broken or pressure within the interior of the carrier 100 is otherwise rising irregularly or rapidly. The auxiliary device 116 may also or instead include a vent for releasing a vacuum in the interior of the carrier 100 to facilitate physically opening the carrier 100 to remove the substrate 106. The vent may be mechanically, magnetically, or electrically operated, or some combination of these. The auxiliary device 116 may also or instead include a vacuum pump connector for increasing, restoring, preserving or otherwise controlling vacuum within the carrier 100. More generally, any number and combination of auxiliary devices 116 may be employed consistent with the scope of this disclosure.

As noted generally above, once the recessed interior 108 has been evacuated and the two carrier halves have been pressed together, the atmospheric pressure around the carrier 100 may provide pressure the keep the two halves 102, 104 tightly pressed together (i.e. the carrier 100 has a self-sealing vacuum coupling that couples the second half 104 on the first half 102). The carrier 100 may also be sealed by mechanical means such as screws, clasps, latches or the like. It will be understood that while single-substrate embodiments are emphasized in this description, other embodiments may store two or more substrates without departing from the scope of this disclosure.

Having described an embodiment of a carrier 100, a process for using the carrier 100 in a vacuum system is now described in greater detail with reference to a number of images that graphically depict various steps of operation. FIGS. 2 through 7 generally depict a complete loading and unloading cycle in which a substrate is transferred from a self-sealing carrier into a vacuum system and subsequently transferred from the vacuum system into a self-sealing carrier. However, it will be understood that individual steps of the method depicted below may be usefully performed in other contexts. For example, an empty carrier may be added to a vacuum system in order to retrieve a substrate, or a substrate may be transferred into the vacuum and the carrier retrieved without any substrate contained therein. All such variations are intended to fall within the scope of this disclosure, notwithstanding the specific loading/unloading cycle depicted below which is provided by way of example and not of limitation.

Figure 2:
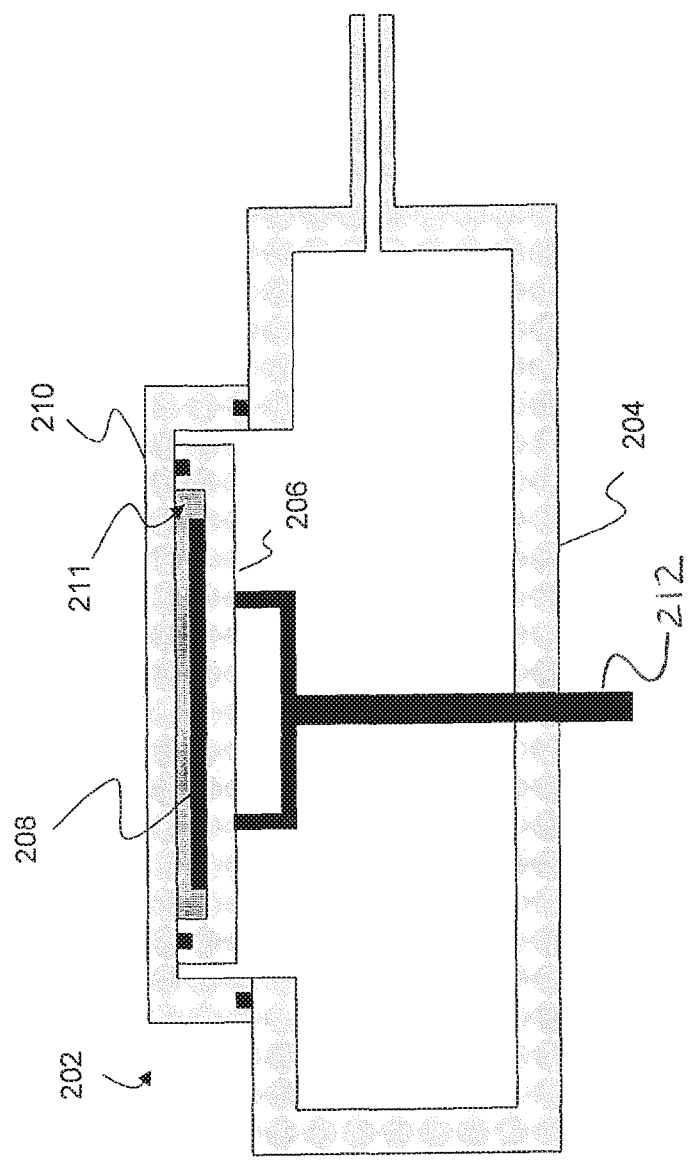
FIG. 2 illustrates the introduction of a carrier to a vacuum chamber.

FIG. 2 illustrates the introduction of a carrier to a vacuum chamber. As depicted, a carrier 202 such as any of the carriers 100 described above is introduced to a vacuum chamber 204. The carrier 202 may include a tray 206 such as the first half 102 of a carrier 100 described above, in which a substrate 208 has been placed, along with a removable plate 210, such as the second half 104 of the carrier 100 described above, that seals the substrate 208 within a vacuum 211. The removable plate 210 of the carrier 202 may be placed in position against the vacuum chamber 204, thus sealing the vacuum chamber 204 with the removable plate 210. It will be understood that the removable plate 210 is removable both with respect to the vacuum chamber 204 and with respect to the tray 206. A vertical lift 212, which may be any suitable robotic handler or the like, may be positioned under the tray 206. Although the tray 206 is retained in position in this illustration by the vacuum 211 (i.e., a self-sealing closure), it will be understood that once the vacuum chamber 204 is evacuated the tray 206 will drop under the force of gravity (i.e., generation of the vacuum within at least part of the interior of the removable plate 210 automatically releases the tray 206 from the removable plate 210 in an autogenous step) unless retained in position by other means. It will be understood that, while described as a method for introducing a substrate to a vacuum chamber, the method described herein may similarly be employed to return a substrate to a vacuum chamber from which it has been removed, or into a different vacuum chamber.

Figure 3:
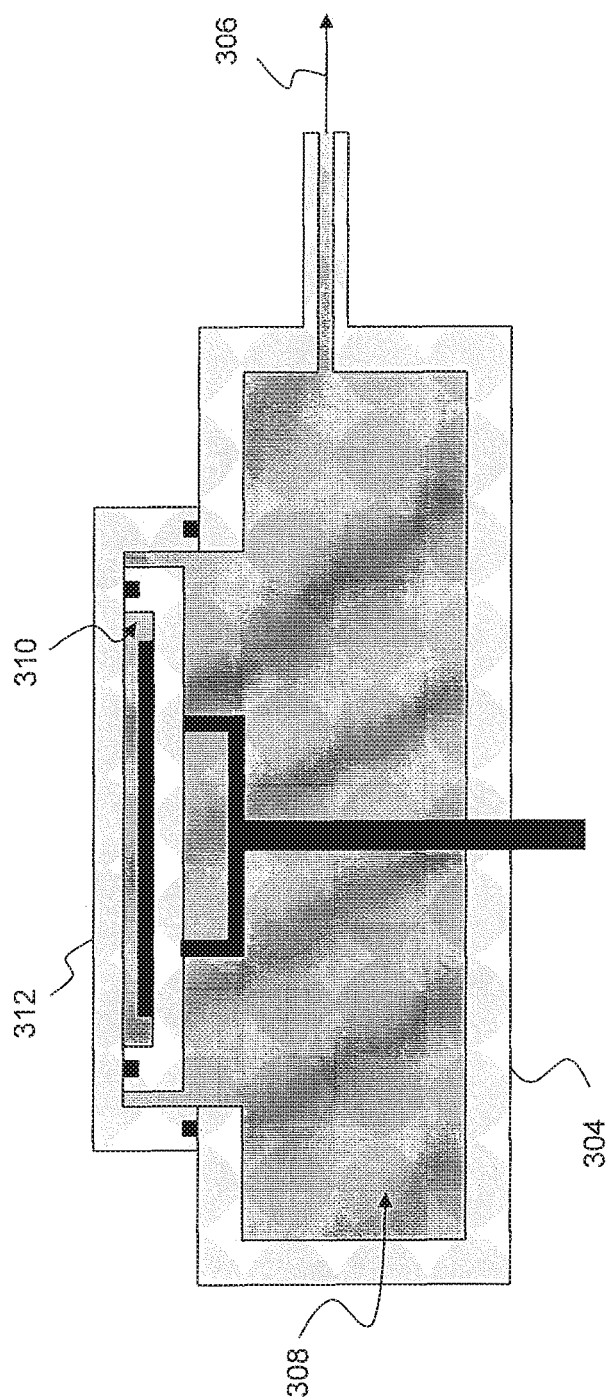
FIG. 3 illustrates the introduction of a carrier to a vacuum chamber.

FIG. 3 illustrates the introduction of a carrier to a vacuum chamber. More specifically, FIG. 3 illustrates evacuation of a vacuum chamber during an introduction process. The vacuum chamber 304, which may be any of the vacuum chambers described above, may be evacuated by operation of a vacuum pump as illustrated generally by an arrow 306. In a typical operation, this evacuation proceeds until the pressure within a first interior 308 of the vacuum chamber 304 is substantially equal to the pressure within a second interior 310 of the carrier 312. At this point, the vacuum chamber 304 is sealed by the removable plate of the carrier 312 and secured in position by the vacuum relative to an external environment. It will be appreciated that while FIGS. 2 and 3 depict the introduction of a substrate into a vacuum environment, that the process may also, or instead, be employed to retrieve a substrate. In such embodiments, the carrier may be placed into position (optionally held together by an interior vacuum), and the vacuum chamber may be pumped down to equalize pressure thus releasing the tray from the removable plate, at which point the tray may be lowered to receive a substrate. In other embodiments, the removable plate may be separately employed to seal the vacuum chamber, with a tray and substrate provided from elsewhere within a vacuum processing system such as a process module, cluster tool, or robotic handler.

Figure 4:
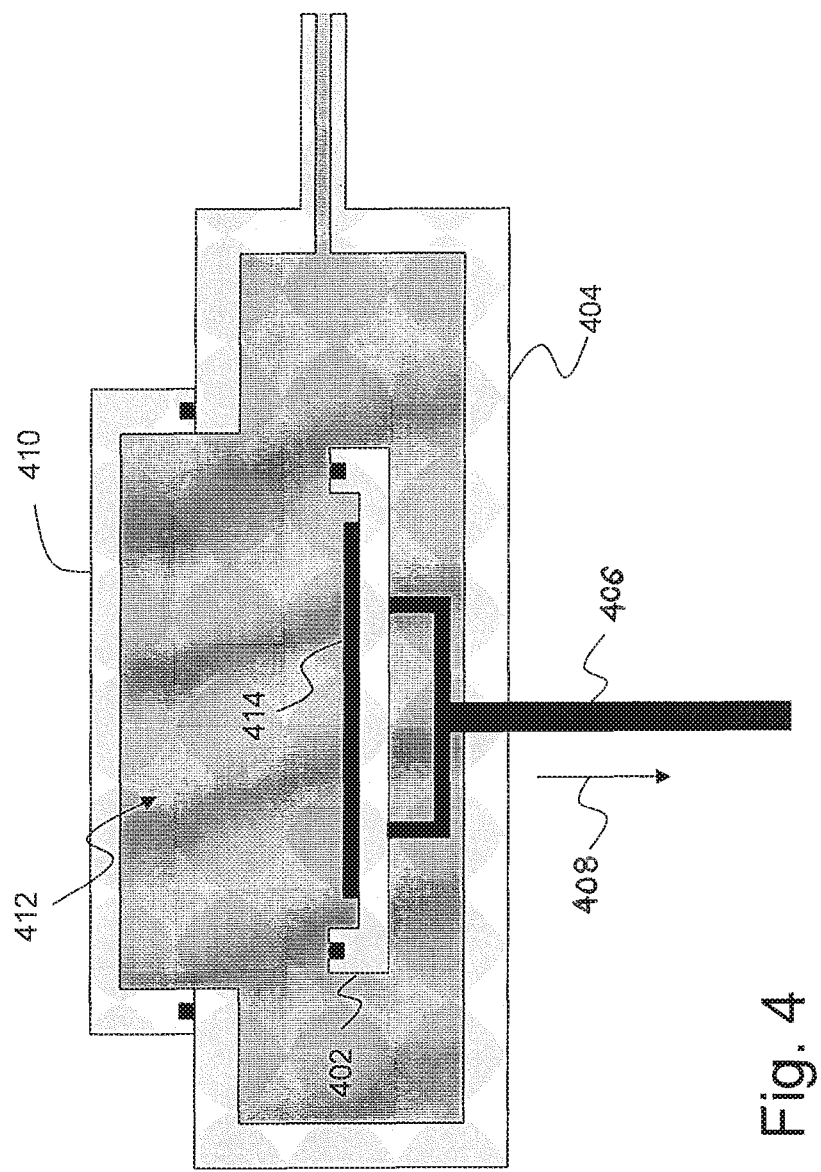
FIG. 4 illustrates the introduction of a carrier to a vacuum chamber.

FIG. 4 illustrates the introduction of a carrier to a vacuum chamber. More particularly, FIG. 4 illustrates a substrate lowering into a vacuum chamber during an introduction process. Once pressure has been equalized between the interior of the carrier and the interior of the vacuum chamber, the tray 402 may be lowered into the vacuum chamber 404 by operation of the vertical lift 406, as generally indicated by an arrow 408. At this point, the vacuum chamber 404 remains sealed by the removable plate 410, thus preserving a vacuum 412 within the vacuum chamber 404. The substrate 414 may be moved within the vacuum chamber 404 and an associated vacuum processing system by any suitable robotic handlers or the like. In one embodiment, the substrate 414 may be removed from the tray 402 for subsequent handling. In other embodiments, subject to the type of process(es) to be performed, the substrate 414 may remain in the tray 402, which may itself be transported within the vacuum processing system.

Figure 5:
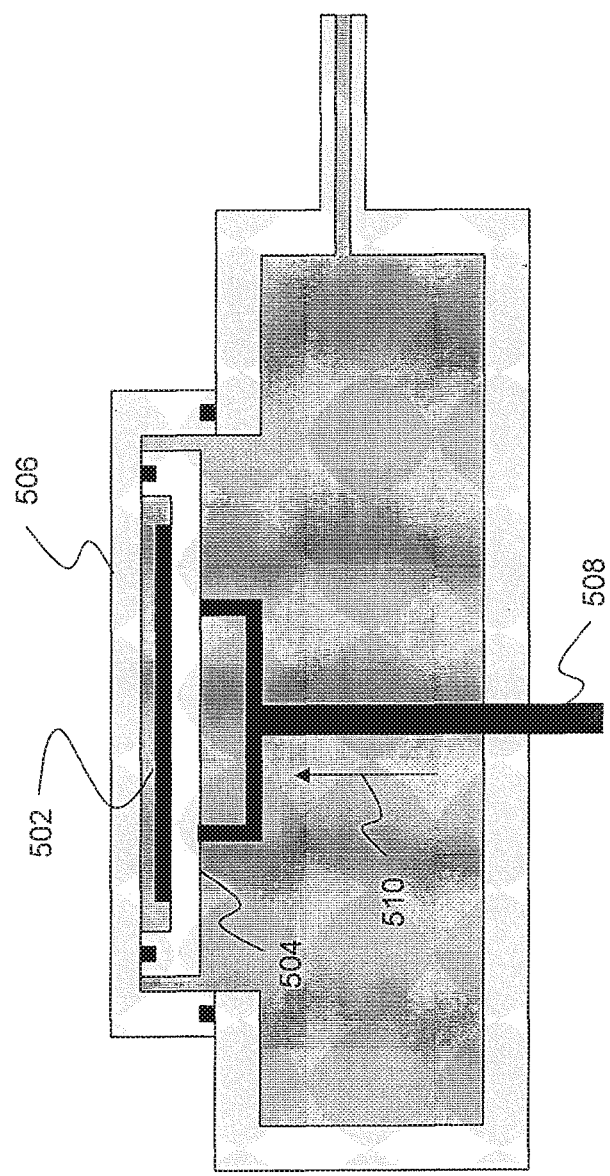
FIG. 5 illustrates the removal of a carrier from a vacuum chamber.

FIG. 5 illustrates the removal of a carrier from a vacuum chamber. With a substrate 502 in a tray 504, the process may begin by moving the tray 504 into a vacuum-sealed engagement with a removable plate 506 to form an enclosed substrate carrier. This move may be performed, for example, by a vertical lift 508 or the like, which may raise the tray 504 into position as generally indicated by an arrow 510.

Figure 6:
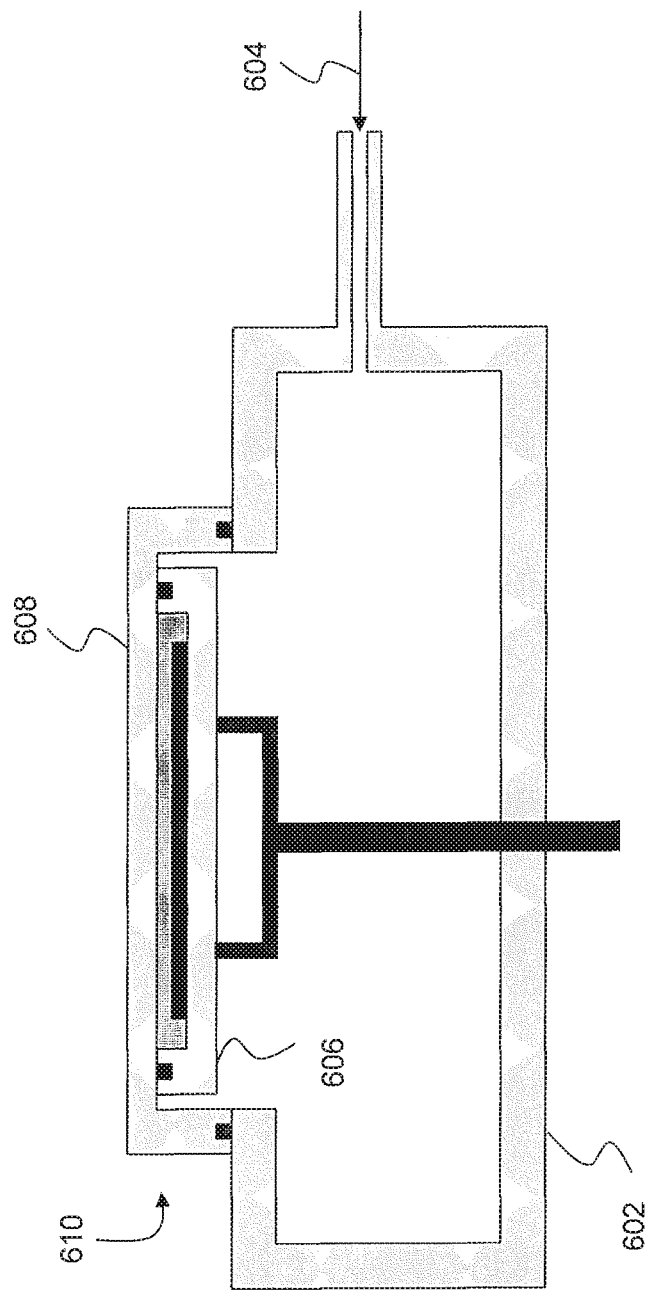
FIG. 6 illustrates the removal of a carrier from a vacuum chamber.

FIG. 6 illustrates the removal of a carrier from a vacuum chamber. More particularly, FIG. 6 illustrates venting of a vacuum chamber during a removal process. During this process, atmospheric air and/or other gasses may be introduced into the vacuum chamber 602 as generally indicated by an arrow 604. With the tray 606 engaged to the removable plate 608, a vacuum (i.e., i.e., a self-sealing vacuum of a self-sealing coupling that couples the removable plate 608 to the tray 606 in an autogenous step born of a removal of vacuum from at least part of the interior of the removable plate 608 enclosing the exterior base seating surface as shown in FIG. 6) may be retained between the tray 606 and the removable plate 608 to form an enclosed substrate carrier 610 with a substrate sealed therein for transportation and/or storage effecting a self-sealing closure of the recessed interior cavity and effecting the vacuum within the recessed interior cavity, and closing the single substrate carrier for substrate carrier transport of the single substrate disposed in the vacuum within the recessed interior cavity.

Figure 7:
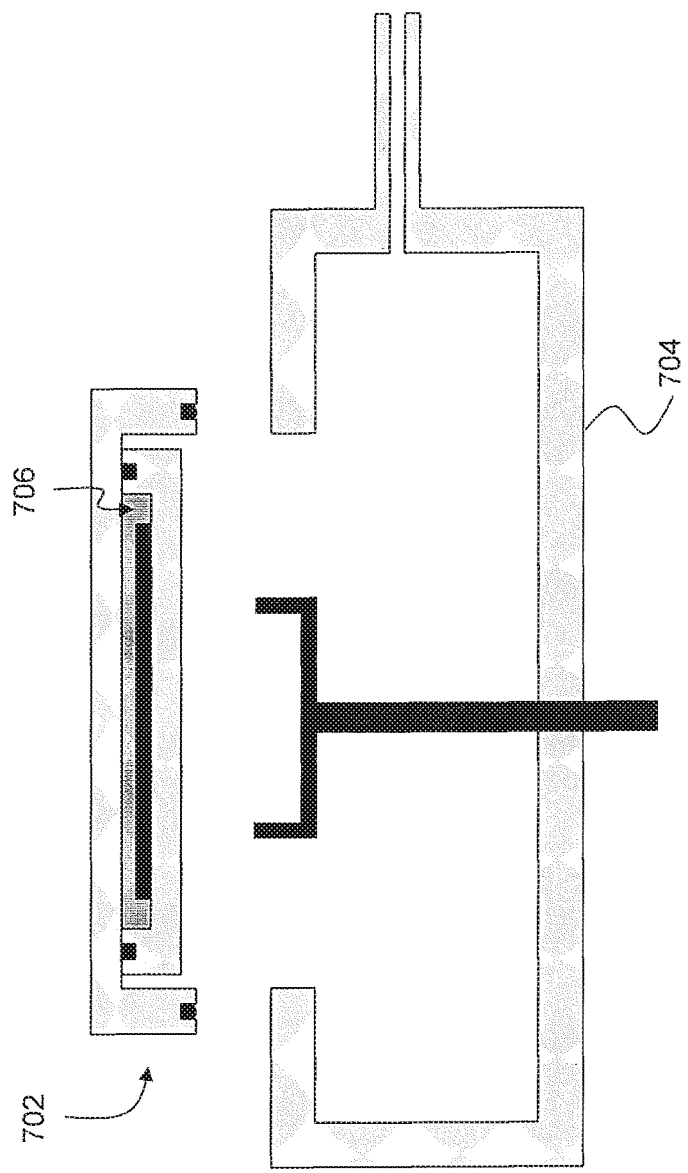
FIG. 7 illustrates the removal of a carrier from a vacuum chamber.

FIG. 7 illustrates the removal of a carrier from a vacuum chamber. More particularly, FIG. 7 shows the physical separation of an enclosed substrate carrier 702. A vacuum within an interior 706 of the enclosed substrate carrier 702 may maintain the two halves of the carrier 702 in a vacuum-sealed engagement for transportation and/or storage of a substrate contained therein so that, as may be realized, the self-sealing vacuum defined by and disposed within the recessed interior cavity 706 effected by the self-sealing closure (as described above) independently holds the first half closed to the second half.

Figure 8:
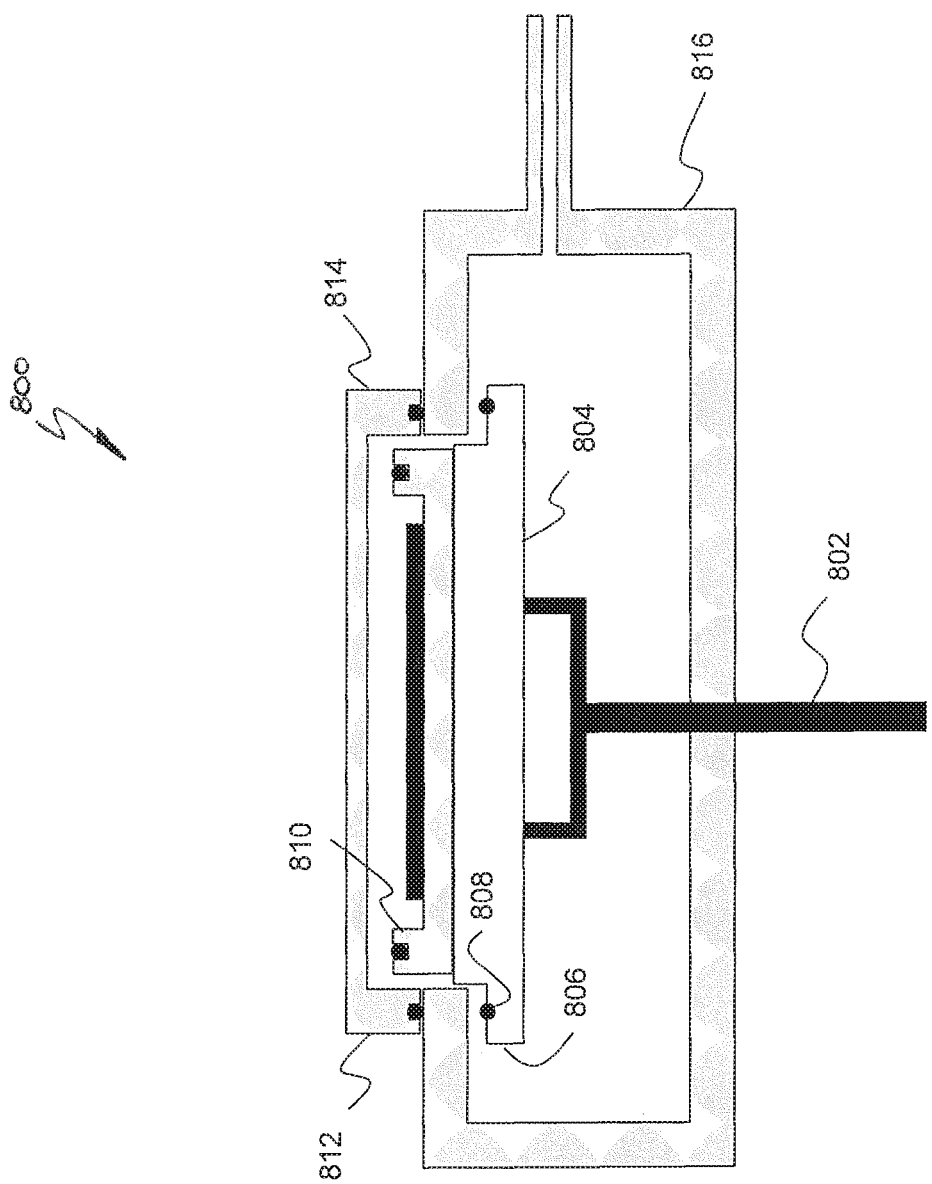
FIG. 8 shows another embodiment of a carrier system.

FIG. 8 shows another embodiment of a carrier system. The system 800 of FIG. 8 is generally similar in design and operation to the systems described above, with differences as noted below. The vertical lift 802 or other handling hardware may include a platform 804 which may be attached to or separate from the vertical lift 802. The bottom edge of the platform 804 may include a flange 806 and a vacuum gasket 808 that cooperate to seal the vacuum chamber 808 from the inside when a tray 810 is moved into contact with a removable plate 812. This arrangement concurrently physically isolates the tray (and more generally the carrier) from the vacuum chamber 816 in a subchamber above the platform 804. Thus only a small volume of space bounded by the exterior of the tray 810, the interior of the removable plate 812, and the platform 804 needs to be vented in order to remove the carrier 814 from the vacuum chamber 816. By venting only this relatively small subchamber, the vacuum chamber 816 may remain in vacuum, thus permitting continued processing of other substrates and mitigating additional pump down of the relatively large interior of the vacuum chamber 816. Conversely, when a new substrate is introduced to the vacuum chamber 816, it is only necessary to pump down the subchamber volume before lowering the vertical lift 802 and retracting the substrate into the vacuum chamber 816.

Figure 9:
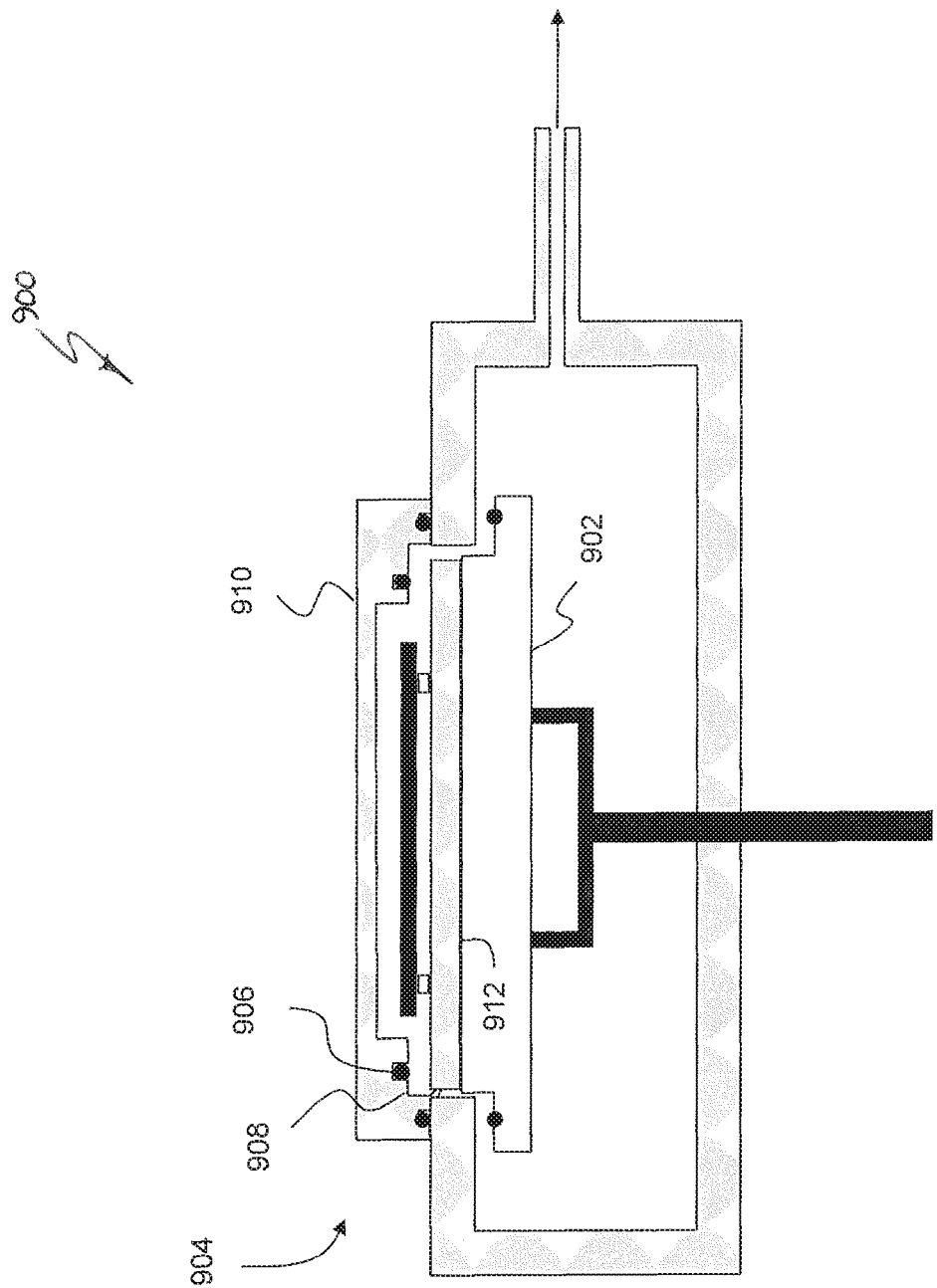
FIG. 9 shows another embodiment of a carrier system.

FIG. 9 shows another embodiment of a carrier system. The system 900 of FIG. 9 is generally similar in design and operation to the systems described above, with differences as noted below. In this embodiment, a platform 902 such as that described above may be employed to isolate the carrier 904 in a subchamber that reduces the volume of space that must be vented or pumped down during substrate transfers. As a further advantage, this approach places a vacuum gasket 906 on a lip 908 within the removable plate 910 of the carrier 904. With this arrangement, the tray 912 no longer requires any perimeter wall or edge, and a substrate on the tray 912 can be readily placed on or retrieved from stand-offs or the like using a conventional end effector that accesses the substrate vertically from the side.

Figure 10:
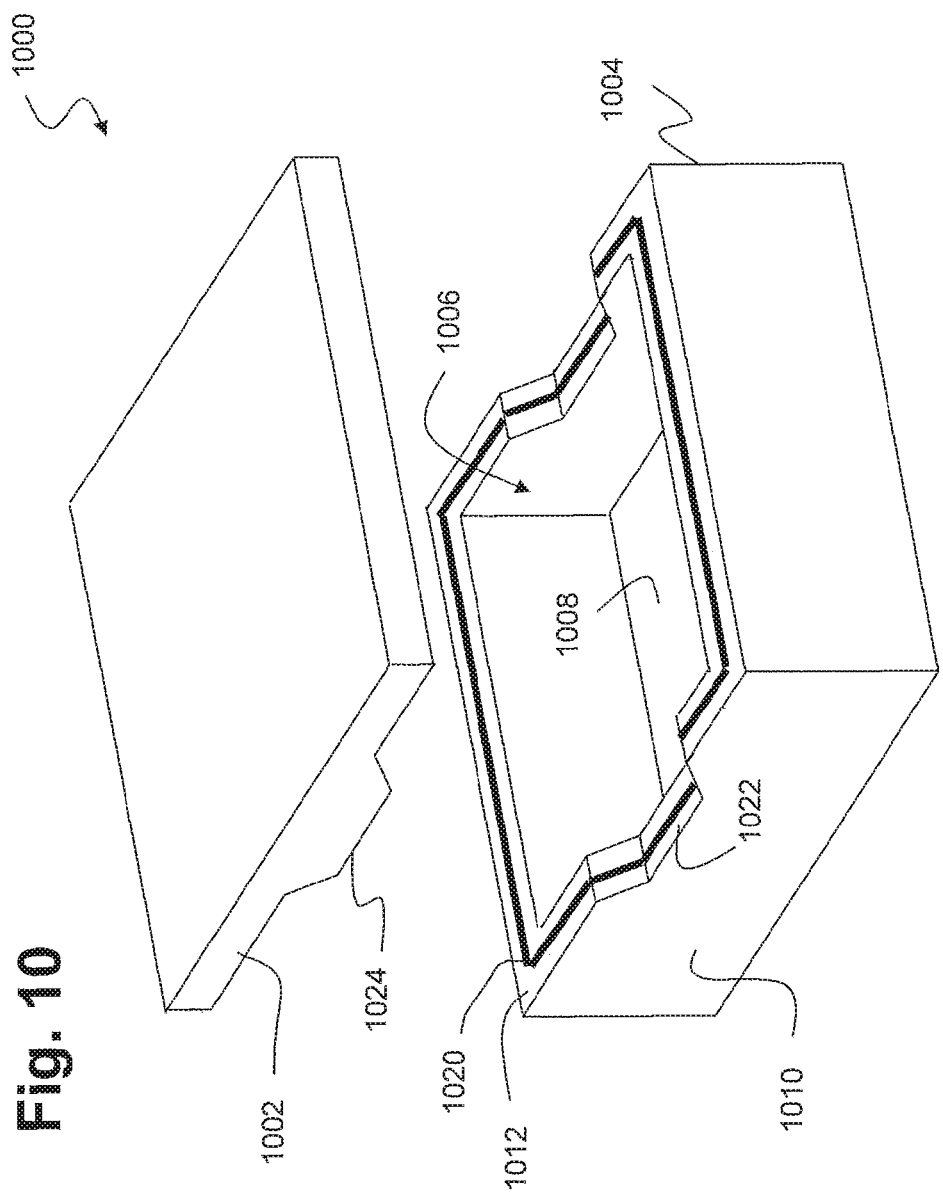
FIG. 10 shows an embodiment of a carrier.

FIG. 10 shows an embodiment of a carrier 1000 that may be employed as a self-sealing, self-aligning, single-substrate storage container with the systems and methods described herein. Although described below as a container and a lid, it will be understood that the following is another embodiment of a self-sealing carrier formed of two halves with mating geometries and an enclosed interior. In general, the carrier 1000 includes a container 1004 and a lid 1002.

The container includes a recessed interior 1006 shaped and sized to receive a single substrate. The container may include a bottom 1008 and a side wall 1010 along a perimeter of the bottom 1008. On a top edge 1012 of the sidewall 1010, a vacuum gasket 1020 may be provided to improve the vacuum seal between the container 1004 and the lid 1002. The top edge 1012 may also include an asymmetric vertical feature 1022 such as a notch, groove, series of steps or protuberances, or the like. The asymmetric vertical feature 1022 generally serves to align the lid 1002 with the container 1004 in a unique alignment (e.g. the lid 1002 is placed on the container 1004 only in a single predetermined orientation) thus preventing misalignment or mis-orientation of the lid 1002.

The lid 1002 may include a second asymmetric vertical feature 1024 that is complementary to the asymmetric vertical feature 1022 of the container 1004. Thus the features of the lid 1002 and container 1004 cooperate to self-align in a desired orientation. By sloping one or more surfaces of the features 1024, 1022, they may also actively align the lid 1002 and container 1004 while the lid 1002 and container 1004 are physically moved together. Thus slight misalignments may be automatically adjusted as the carrier is sealed.

A pressure sensor or any of the other auxiliary devices described above may be disposed on the lid 1002 or the container 1004 as generally described above.

In certain embodiments, the systems and methods described herein may be used in place of a load lock for a vacuum processing system, particularly where it is desired to retain a substrate in a vacuum environment between processes or the like. In other embodiments, the systems and methods described herein may be used in addition to a conventional load lock so that some substrates can be individually stored in vacuum (while other substrates are removed from a vacuum processing system using a conventional load lock).

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

What is claimed is:

1. A single substrate carrier for carrying a single substrate comprising:
    a first half of the single substrate carrier with a recessed interior cavity having a single substrate carrier single substrate support formed by substrate support elements that are configured to hold but one substrate, that is the single substrate carried by the single substrate carrier, within the cavity and having an exterior seating base surface opposite the single substrate support and forming an exterior base of the single substrate carrier when closed, the first half having a first perimeter wall forming the recessed interior cavity, the first perimeter wall including a vacuum gasket and being unitary with the exterior seating base surface; and
    a second half of the single substrate carrier adjacent to the first half, the second half including a second perimeter wall forming a second interior having an opening formed by the second perimeter wall and an interior face disposed within the bounds of the opening, the interior face including a surface that contacts the vacuum gasket to form a vacuum seal that retains a vacuum within the recessed interior cavity, where when the second half is coupled to the first half the second perimeter wall extends so that the second interior encloses the first half including the exterior base seating surface, wherein the exterior base seating surface is enclosed within the second interior, and wherein the recessed interior cavity defines a self-sealing vacuum of a self-sealing coupling that couples the second half to the first half in an autogenous step born of a removal of vacuum from at least part of the second interior enclosing the exterior base seating surface, and effecting a self-sealing closure of the recessed interior cavity and effecting the vacuum within the recessed interior cavity, and closing the single substrate carrier for substrate carrier transport of the single substrate disposed in the vacuum within the recessed interior cavity, so that the self-sealing vacuum defined by and disposed within the recessed interior cavity effected by the self-sealing closure independently holds the first half closed to the second half and generation of the vacuum within at least part of the second interior automatically releases the second half from the first half in an autogenous step.

2. The single substrate carrier of claim 1 wherein the second perimeter wall includes a second vacuum gasket shaped and sized to form a vacuum seal with a substrate handling device.

3. The single substrate carrier of claim 1 wherein at least one of the first half and the second half has a pressure sensor disposed thereon for monitoring a vacuum level within the recessed interior cavity.

4. The single substrate carrier of claim 3 wherein the pressure sensor includes an active vacuum gauge for measuring pressure based upon a measurement from an interior of the device.

5. The single substrate carrier of claim 3 wherein the pressure sensor includes an external sensor for measuring pressure based upon a measurement of an exterior surface of the device.

6. The single substrate carrier of claim 1 wherein the substrate includes one or more of a wafer and a reticle.

7. The single substrate carrier of claim 1 wherein the vacuum gasket is an o-ring, the perimeter including a groove for retaining the o-ring in a predetermined position.

8. A single substrate carrier for carrying a single substrate comprising:
   a container with a recessed interior shaped and sized to receive but one substrate, that is the single substrate carried by the single substrate carrier, so that a single substrate carrier single substrate support, formed by substrate support elements, is disposed within the recessed interior, the recessed interior formed by a bottom and side walls along a perimeter of the bottom where the bottom is opposite the single substrate support and forms an exterior of the single substrate carrier when closed, the side walls having a top edge with an asymmetrically located geometric feature formed in or on the top edge of two opposing side walls and a vacuum gasket along an entire length of the top edge including along the asymmetrical geometric feature around the recessed interior, each of the asymmetrically located geometric features being asymmetrically located relative to a length of a respective side wall;
   a lid matable to the container for closing the container, the lid having a second asymmetrically located geometric feature configured to releasably mate with the asymmetrically located geometric feature of the container, the asymmetrically located geometric feature and the second asymmetrically located geometric features have complimentary guiding surfaces configured to actively align the lid and the container during mating movement between the lid and the container, wherein mating between the container and lid causes placement of the lid on the container only in a single, predetermined orientation; and
   at least one of the container and the lid has an external pressure sensor disposed thereon for monitoring a vacuum level within the recessed interior based upon a measurement of an exterior surface of the container or lid;
   wherein the recessed interior defines a self-sealing vacuum of a self-sealing vacuum coupling, and the recessed interior, the lid, and the top edge are configured so that the self-sealing vacuum of the self-sealing vacuum coupling couples the lid and top edge in an autogenous step born of a removal of vacuum from around at least a portion of the top edge, and effecting a self-sealing closure of the recessed interior with a substantially contaminant-free vacuum-sealed interior so that the self-sealing vacuum defined by the recessed interior and effected by the self-sealing closure independently holds the lid closed to the top edge and generation of the self-sealing vacuum around at least part of the top edge automatically releases the lid from the top edge of the container in an autogenous step.

9. The single substrate carrier of claim 8 further comprising a pressure sensor disposed on one or more of the container or the lid to monitor a vacuum within the vacuum-sealed interior.

10. The single substrate carrier of claim 1, wherein the second half and the first half are coupled by at least a pressure surrounding the substrate transport carrier second half and the substrate transport carrier first half.

11. The single substrate carrier of claim 8, wherein each of the asymmetrically located geometric features are substantially similar to each other.

12. The single substrate carrier of claim 1, wherein the interior face of the second interior includes a surface facing the but one substrate support that contacts the vacuum gasket to form the vacuum seal that retains the vacuum within the recessed interior cavity.

* * * * *